(12) United States Patent
Mok et al.

(10) Patent No.: US 8,592,135 B2
(45) Date of Patent: Nov. 26, 2013

(54) METHOD OF MANUFACTURING PRINTED CIRCUIT BOARD

(75) Inventors: Jee Soo Mok, Gyunggi-do (KR); Je Gwang Yoo, Gyunggi-do (KR); Eung Suek Lee, Gyunggi-do (KR); Chang Sup Ryu, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 2 days.

(21) Appl. No.: 13/403,380

(22) Filed: Feb. 23, 2012

(65) Prior Publication Data

US 2012/0148960 A1  Jun. 14, 2012

Related U.S. Application Data

(62) Division of application No. 12/222,177, filed on Aug. 4, 2008, now abandoned.

(30) Foreign Application Priority Data

Jun. 9, 2008  (KR) .................. 10-2008-0053667

(51) Int. Cl.
  *G03F 7/26*  (2006.01)
(52) U.S. Cl.
  USPC .......................................................... 430/311
(58) Field of Classification Search
  USPC .......................................................... 430/311
  See application file for complete search history.

(56) References Cited

U.S. PATENT DOCUMENTS

| 7,100,276 B2 * | 9/2006 | Fukuoka et al. ................. 29/830 |
| 2001/0011774 A1 | 8/2001 | Tsunoi et al. |
| 2007/0152194 A1 * | 7/2007 | Natekar et al. ................. 252/500 |

FOREIGN PATENT DOCUMENTS

JP  2006120665  5/2006

OTHER PUBLICATIONS

U.S. Patent Restriction Requirement mailed Jun. 8, 2011 in corresponding U.S. Appl. No. 12/222,177.
U.S. Patent Office Action mailed Jul. 20, 2011 in corresponding U.S. Appl. No. 12/222,177.
U.S. Patent Office Action mailed Nov. 28, 2011 in corresponding U.S. Appl. No. 12/222,177.
U.S. Appl. No. 12/222,177, filed Aug. 4, 2008, Jee Soo Mok, Samsung Electro-Mechanics Co., Ltd.
U.S. Appl. No. 12/178,285, filed Jul. 23, 2008, Eung-Seuk Lee et al., Samsung Electro-Mechanics Co., Ltd.
U.S. Appl. No. 12/222,176, filed Aug. 4, 2008, Eung-Seuk Lee et al., Samsung Electro-Mechanics Co., Ltd.
U.S. Appl. No. 12/263,685, filed Nov. 3, 2008, Eung-Seuk Lee et al., Samsung Electro-Mechanics Co., Ltd.

* cited by examiner

*Primary Examiner* — Kathleen Duda

(57) ABSTRACT

A method of manufacturing a printed circuit board, including: applying a conductive paste including carbon nanotubes and a photosensitive binder on a bump-forming area of a circuit substrate having a circuit layer for transferring electrical signals; and patterning the conductive paste, thus forming bumps.

7 Claims, 4 Drawing Sheets

METHOD OF MANUFACTURING PRINTED CIRCUIT BOARD

CROSS-REFERENCE TO RELATED APPLICATIONS

This application is a U.S. divisional application filed under 37 CFR 1.53(b) claiming priority benefit of U.S. Ser. No. 12/222,177 filed in the United States on Aug. 4, 2011, which claims earlier priority benefit to Korean Patent Application No. 10-2008-0053667 filed with the Korean Intellectual Property Office on Jun. 9, 2008, the disclosures of which are incorporated herein by reference.

BACKGROUND

1. Field

The present invention relates to a printed circuit board (PCB) and a method of manufacturing the same, and more particularly, to a PCB, which includes bumps formed using a conductive paste including carbon nanotubes and a photosensitive binder, and to a method of manufacturing the same.

2. Description of the Related Art

Conventionally, the formation of solder bumps on a substrate includes a method of printing solder paste on a substrate or a wafer and performing a reflow process (FIGS. 1A to 1E), an electroless plating method, or an electroplating method.

With reference to FIG. 1A, a solder resist 15 is formed on a substrate 11 having pads 13. The solder resist 15 is formed between the pads 13, and functions to prevent the downward flow of solder paste 19 in the subsequent course of forming bumps 23.

As shown in FIG. 1B, a printing mask 17 is located on the solder resist 15. The printing mask 17 functions such that the solder paste is applied to a predetermined height on the pads 13 while preventing the application of the solder paste on the solder resist 15 in the subsequent course of printing the solder paste. As shown in FIG. 1C, the solder paste 19 is printed on the pads 13 using a squeegee blade 21. The solder paste 19 fills recesses defined by the solder resist 15 and the printing mask 17, as shown in FIG. 1C.

As shown in FIG. 1D, the printing mask 17 located on the solder resist 15 is removed, and a reflow process is performed, thereby completing a PCB including bumps 23, as shown in FIG. 1E.

However, the method of forming the bumps of the PCB using printing is problematic in that bumps having a fine pitch of 120 μm or less are difficult to realize. Thus, the method of forming the bumps using printing cannot be applied when it is intended to form fine bumps. Even if such bumps are formed, the volume thereof becomes very small.

Presently, the size of a PCB, which enables the formation of bumps through printing, approximates a quarter size or a half size. Hence, it is impossible to perform a panel-size bumping process.

SUMMARY

Therefore, the present invention has been made keeping in mind the above problems encountered in the related art, and provides a PCB having a fine pitch using a conductive paste including carbon nanotubes and a photosensitive binder, and a method of manufacturing the PCB, which enables the bumping on a panel-size substrate.

According to the present invention, a PCB may comprise a circuit substrate having a circuit layer for transferring electrical signals; and bumps electrically connected to the circuit layer and formed of a conductive paste including carbon nanotubes and a photosensitive binder.

According to a preferred feature of the present invention, the circuit substrate may further comprise external connection terminals exposed in the outermost circuit layer thereof, and the bumps may be formed on the external connection terminals.

According to another preferred feature of the present invention, the bumps may have a stepped cylindrical shape.

According to a further preferred feature of the present invention, the conductive paste may further comprise metal powder.

According to still a further preferred feature of the present invention, the photosensitive binder may be any one selected from among acrylic resin, styrene resin, novolac epoxy resin, and polyester resin.

In addition, according to the present invention, a method of manufacturing a PCB may comprise (A) applying a conductive paste including carbon nanotubes and a photosensitive binder on the bump-forming area of a circuit substrate having a circuit layer for transferring electrical signals; and (B) patterning the conductive paste, thus forming bumps.

According to a preferred feature of the present invention, the conductive paste may further comprise metal powder.

According to another preferred feature of the present invention, the circuit substrate may further comprise external connection terminals exposed in the outermost circuit layer thereof, and the bump-forming area may comprise an area in which the external connection terminals are exposed.

According to a further preferred feature of the present invention, forming the bumps may comprise (i) disposing a mask having light-blocking patterns for forming the bumps on the conductive paste; and (ii) radiating light onto the mask, thus selectively exposing the conductive paste to light, and then developing the conductive paste.

According to still a further preferred feature of the present invention, forming the bumps may further comprise drying the bumps, after (ii) radiating light.

According to yet another preferred feature of the present invention, the mask may be a glass mask.

According to still another preferred feature of the present invention, developing in (ii) radiating light may be conducted using any one developer selected from among Na2CO3, KCO3,and KOH.

The features and advantages of the present invention will be more clearly understood from the following detailed description taken in conjunction with the accompanying drawings.

Further, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

DESCRIPTION OF EMBODIMENTS

Figure 1A:
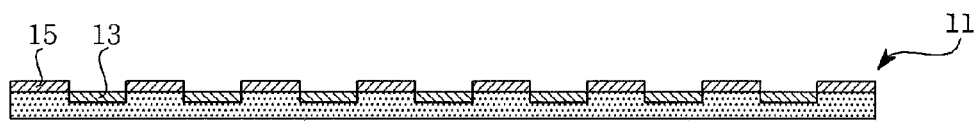
FIGS. 1A to 1E are schematic views sequentially showing a conventional process of manufacturing a PCB by printing a solder paste and then performing reflow.
Figure 1B:
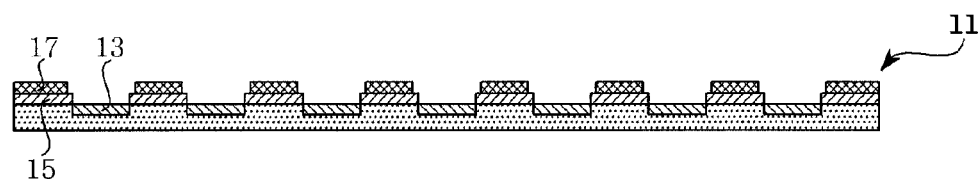
Figure 1C:
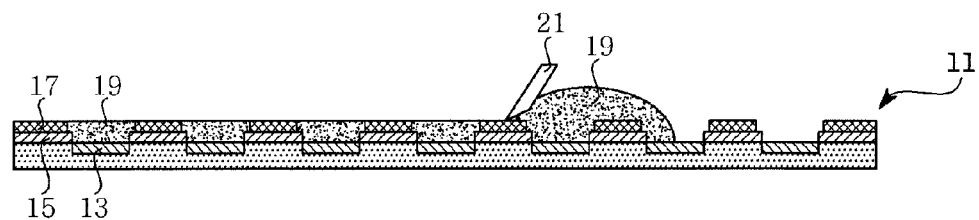
Figure 1D:
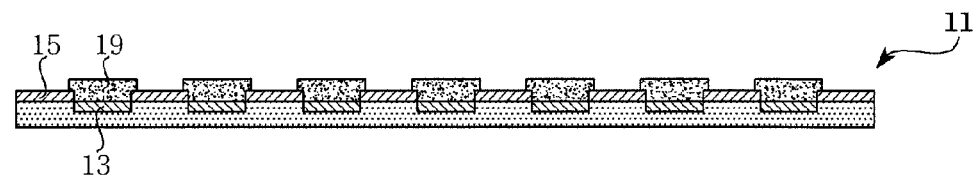
Figure 1E:
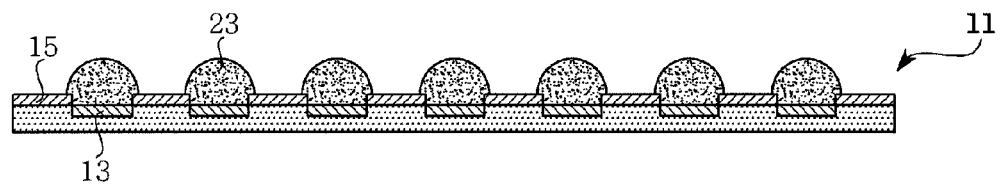

Hereinafter, a detailed description will be given of a PCB and a method of manufacturing the same according to the present invention, with reference to the appended drawings. Throughout the drawings, like reference numerals refer to like elements, and redundant descriptions are omitted. In the description, the terms "first", "second" and so on are used to distinguish one element from another element, but are not to be construed to limit the elements.

Figure 2:
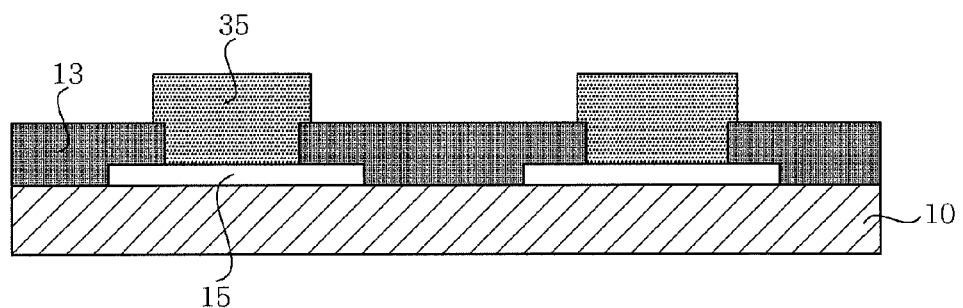
FIG. 2 is a cross-sectional view illustrating a PCB having bumps formed using a conductive paste including carbon nanotubes and a photosensitive binder, according to the present invention.

FIG. 2 is a cross-sectional view showing the PCB according to the present invention. As shown in FIG. 2, the PCB according to the present invention includes a circuit substrate 10 having a circuit layer for transferring electrical signals, and bumps 35 electrically connected to the circuit layer and formed using a conductive paste 30 including carbon nanotubes and a photosensitive binder.

The circuit substrate 10 is used to mount electronic parts and for wiring, and is typically a PCB obtained by etching a metal layer along a circuit pattern (the portion of the metal layer other than circuit lines is removed through etching), thus forming a necessary circuit layer, and forming bumps 35 and holes for attaching and mounting electronic parts on the outermost circuit layer. The circuit substrate 10 may be a single-sided PCB, in which a circuit layer is formed on only one surface of an insulating substrate, a double-sided PCB, in which a circuit layer is formed on both surfaces of an insulating substrate, or a multilayered board (MLB) having multiple circuit layers.

The circuit layer is composed of circuit patterns for transferring electrical signals along a designed pattern. The circuit pattern is a conductive line formed on the insulating substrate using highly conductive metal, such as copper or nickel. In particular, the circuit layer, which is disposed on the outermost surface of the circuit substrate 10, is referred to as an outermost circuit layer. The outermost circuit layer is provided with external connection terminals 15 to connect the substrate to electronic parts. The external connection terminal 15 may further include a nickel layer or a gold layer as a surface treatment layer in addition to the metal for the circuit layer. Furthermore, in order to prevent the corrosion and etching of the outermost circuit layer, the portion of the outermost circuit layer other than the external connection terminals 15 is covered with the solder resist layer 13 and is thus protected.

The bumps 35 are a conductive member formed on the external connection terminals 15 to electrically interconnect the layers of the MLB or to electrically physically connect the electronic parts and the PCB. In the present invention, the bumps for connecting the electronic parts and the PCB are depicted and described.

As shown in FIG. 2, the bumps 35 of the PCB according to the present invention may be formed in a stepped cylindrical shape, using a conductive paste 30 including carbon nanotubes and a photosensitive binder. In addition, the conductive paste 30 used in the present invention may further include metal powder, a curing agent, and a thixotrophic agent. Specific components of the conductive paste 30 used in the present invention are shown in Table 1 below. The components of Table 1 are illustrative, and the present invention is not limited thereto.

TABLE 1

Components of Conductive Paste

| Components | Amount (wt %) | Note |
|---|---|---|
| Carbon Nanotubes (CNT) | 50~90 | Use of SWNT or MWNT |
| Metal Powder (size: 1 μm or less) | 10~30 | Ag, Cu, Sn, Bi, Sn/Ag, Sn/Bi, Ag/Cu/Sn, Mixing of Sn and other metal at a ratio of 7:3 |
| Photosensitive Binder | 5~20 | Photosensitive Resin Binder (epoxy) |
| Additive | 0.5~5.0 | Curing Agent, Thixotrophic Agent |
| Solvent | 5~10 | — |

Compared to other material (e.g., copper), carbon nanotubes exhibit superior electrical properties. For example, Table 2 below shows the properties of carbon nanotubes and other material

TABLE 2

Properties of Carbon Nanotubes and Comparative Material

| Physical Properties | Carbon Nanotubes | Comparative Material |
|---|---|---|
| Density | 1.33~1.40 g/□ | 2.7 g/□ |
| Current Density | $1 \times 10^9$ A/cm$^2$ | $1 \times 10^6$ A/cm$^2$ (copper cable) |
| Thermal Conductivity | 6000 W/mK | 400 W/mK (copper) |
| Resistivity | $1 \times 10^{-10}$ Ωcm | $1 \times 10^{-10}$ Ωcm (copper) |

As is apparent from the table, the carbon nanotubes have electrical properties superior to those of metal material, such as aluminum or copper, which have good properties in terms of electrical conductivity and resistivity. Thus, the PCB according to the present invention has the bumps 35 formed using a composition including carbon nanotubes, and thereby exhibits better electrical connection with electronic parts mounted thereon, compared to conventional PCBs having bumps 35 formed of other material.

In the present invention, the photosensitive binder may be any one selected from among acrylic resin, styrene resin, novolac epoxy resin, and polyester resin.

In this way, because the PCB according to the present invention has the bumps formed using the conductive paste including carbon nanotubes, it can realize good electrical connection with electronic parts mounted thereon.

Below, the method of manufacturing the PCB according to the present invention is described. FIGS. 3 to 6 sequentially show the process of manufacturing the PCB according to the present invention.

Figure 3:
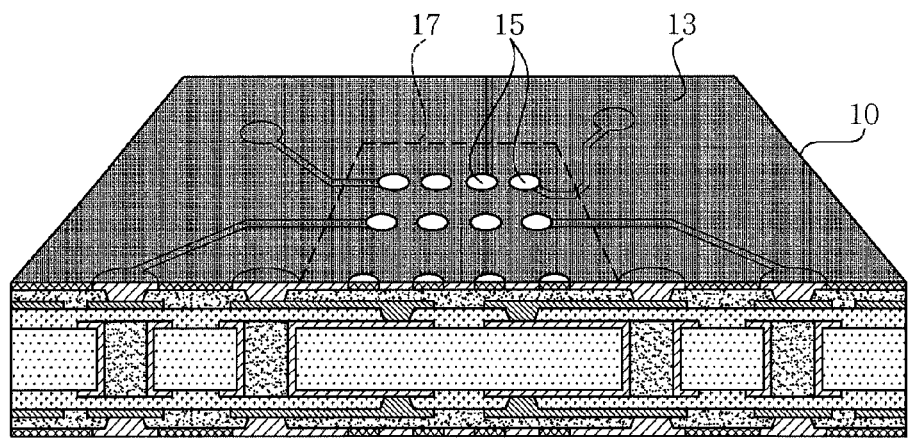
FIGS. 3 to 6 are schematic views sequentially showing a process of manufacturing the PCB having bumps formed using the conductive paste including carbon nanotubes and a photosensitive binder, according to the present invention.

As shown in FIG. 3, the circuit substrate 10 having the circuit layer for transferring electrical signals is provided. The circuit substrate 10 may be a single-sided PCB, a double-sided PCB in which a circuit layer is formed on both surfaces of an insulating substrate, or an MLB having multiple circuit layers, and includes external connection terminals 15 exposed in the outermost circuit layer.

The external connection terminals 15 may be uniformly distributed over the entire area of the outermost circuit layer of the circuit substrate 10. Specifically, as shown in FIG. 3, the external connection terminals are mainly formed on a predetermined area of the outermost layer, that is, the area on which electronic parts are mounted. For convenience, the area on which the external connection terminals 15 are mainly present is referred to as a bump-forming area 17. In an exemplary embodiment, the circuit substrate 10 has a bump-forming area 17 in which twelve external connection terminals 15 are exposed in the center of the outermost circuit layer.

Figure 4:
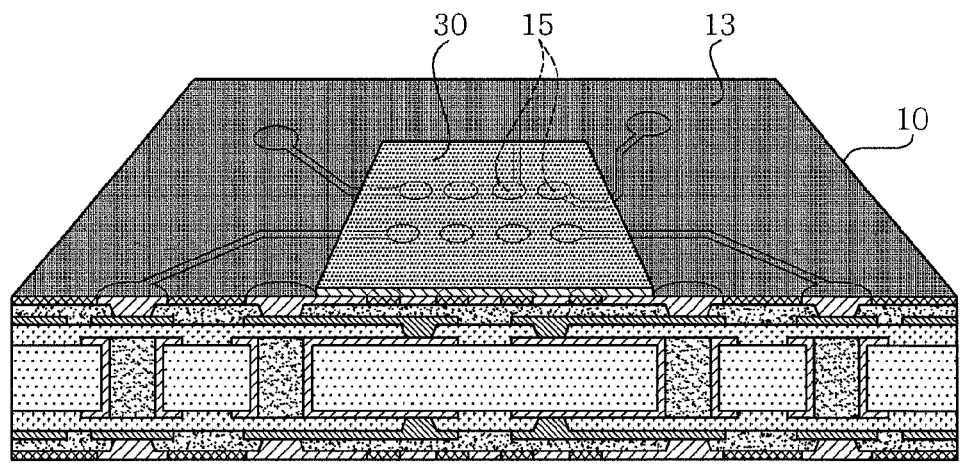

Next, as shown in FIG. 4, the conductive paste 30, including carbon nanotubes and a photosensitive binder, is applied on the bump-forming area 17. The specific components of the conductive paste 30 are mentioned as above. In the present invention, using a metal mask having openings corresponding to the bump-forming area 17, the conductive paste is applied through printing. However, the process of applying the conductive paste is not limited thereto, and it is noted that the conductive paste may be applied over the entire area of the outermost layer of the circuit substrate.

The photosensitive binder included in the conductive paste 30 may be a negative type or a positive type. In an exemplary embodiment, useful is a positive type photosensitive binder, that is, a photosensitive binder by which a portion not irradiated with light is cured, as will be described later.

After the application of the conductive paste 30 is completed, the conductive paste 30 is patterned through exposure and development, thus forming the bumps 35. The patterning of the conductive paste 30 through exposure and development enables more accurate control than when using a printing process, and is thus applied to a panel-size substrate.

Figure 5:
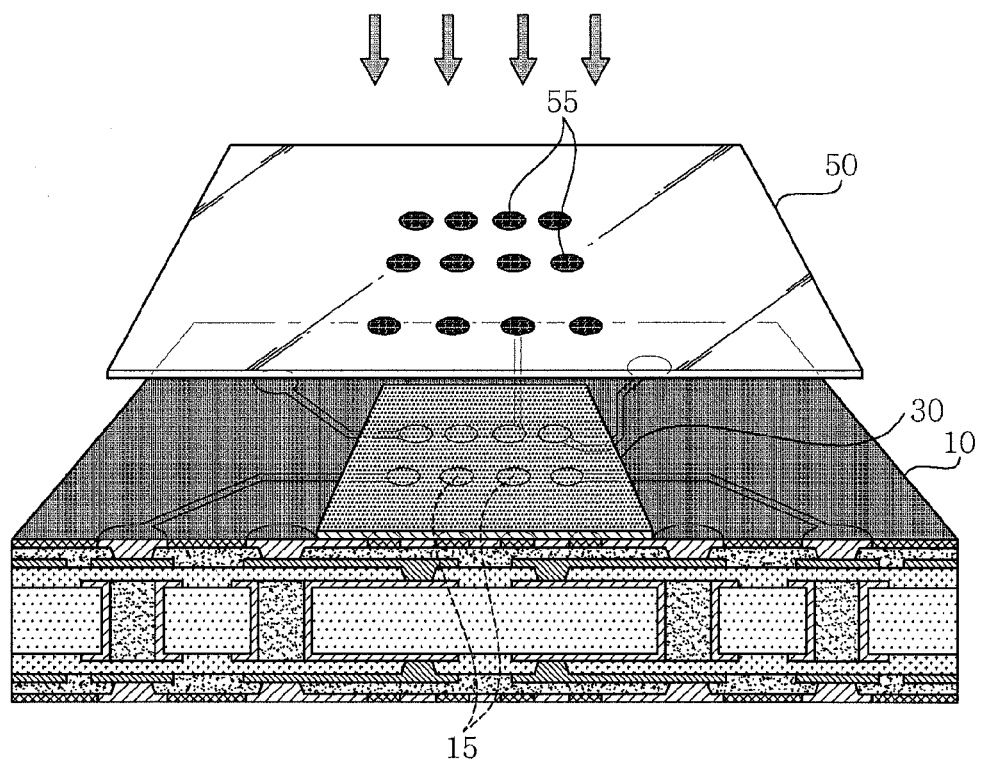

As shown in FIG. 5, a glass mask 50 having light-blocking patterns 55 at positions at which the bumps 35 are to be formed is disposed on the conductive paste 30, and UV light is radiated via the glass mask 50, thus curing the portions of the conductive paste 30 corresponding to the bumps 35. As mentioned above, because the conductive paste 30 includes a positive type photosensitive binder, the portions of the outermost circuit layer onto which light is not radiated, namely bumps 35, are cured.

In the present invention, the use of the glass mask 50 is mentioned, but the present invention is not limited thereto. Alternatively, another kind of mask, such as an art work film, may be used. However, in order to form the bumps 35 at a fine pitch, it is preferred that the glass mask 50 be used.

Figure 6:
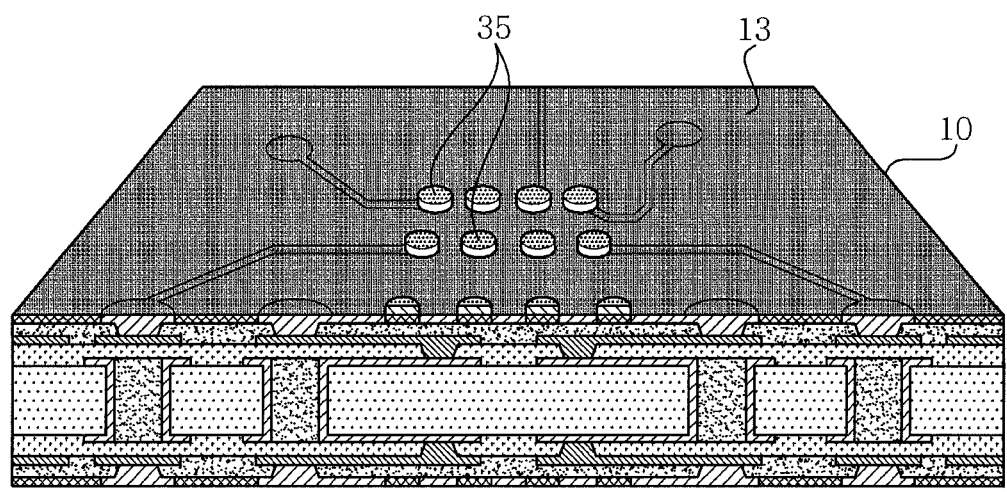

Next, as shown in FIG. 6, the conductive paste 30 which is not cured is removed through development. As such, the development is conducted using a developer, which is any one selected from among Na2CO3, KCO3, and KOH. Thereafter, a drying process is conducted, thus completing the bumps 35 having a stepped cylindrical shape as shown in FIG. 2. The drying process is typically performed at 160~180° C. for 30~90 min.

In the method of manufacturing the PCB according to the present invention, because the conductive paste 30 including carbon nanotubes and a photosensitive binder is used, a bumping process can be conducted even on a panel-size substrate, and the bumps 35 having a fine pitch can be formed.

As described hereinbefore, the present invention provides a PCB and a method of manufacturing the same. The PCB according to the present invention includes bumps formed using a conductive paste having carbon nanotubes, and thus can realize good electrical connection with electronic parts mounted thereon. Further, the bumps are formed at a fine pitch, thus forming a circuit layer having a high density.

In the method of manufacturing the PCB according to the present invention, because the conductive paste including carbon nanotubes and a photosensitive binder is used, a bumping process can be realized even on a panel-size substrate, and bumps having a fine pitch can be formed.

Although the preferred embodiments of the present invention have been disclosed for illustrative purposes, those skilled in the art will appreciate that various modifications, additions and substitutions are possible within the technical scope of the invention.

What is claimed is:

1. A method of manufacturing a printed circuit board, comprising:
    applying a conductive paste including carbon nanotubes and a photosensitive binder on a bump-forming area of a circuit substrate having a circuit layer for transferring electrical signals; and
    patterning the conductive paste, thus forming bumps.

2. The method as set forth in claim 1, wherein the conductive paste further comprises metal powder.

3. The method as set forth in claim 1, wherein the circuit substrate further comprises external connection terminals exposed in an outermost circuit layer thereof, and the bump-forming area comprises an area in which the external connection terminals are exposed.

4. The method as set forth in claim 1, wherein the forming the bumps comprises:
    disposing a mask having light-blocking patterns for forming the bumps on the conductive paste; and
    radiating light onto the mask, thus selectively exposing the conductive paste to light, and then developing the conductive paste.

5. The method as set forth in claim 4, wherein the forming the bumps further comprises drying the bumps, after the radiating light.

6. The method as set forth in claim 4, wherein the mask is a glass mask.

7. The method as set forth in claim 4, wherein the developing is conducted using a developer selected from the group consisting of Na2CO3, KCO3, and KOH.

* * * * *